US009355842B2

(12) United States Patent
Seacrist et al.

(10) Patent No.: US 9,355,842 B2
(45) Date of Patent: *May 31, 2016

(54) DIRECT AND SEQUENTIAL FORMATION OF MONOLAYERS OF BORON NITRIDE AND GRAPHENE ON SUBSTRATES

(71) Applicants: SunEdison Semiconductor Limited (UEN201334164H), Singapore (SG); Kansas State University Research Foundation, Manhattan, KS (US)

(72) Inventors: Michael R. Seacrist, Lake St. Louis, MO (US); Vikas Berry, Manhattan, KS (US); Phong Tuan Nguyen, Wichita, KS (US)

(73) Assignees: SunEdison Semiconductor Limited (UEN201334164H), Singapore (SG); Kansas State University Research Foundation, Manhatton, KS (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/608,661

(22) Filed: Jan. 29, 2015

(65) Prior Publication Data

US 2015/0144881 A1    May 28, 2015

Related U.S. Application Data

(60) Division of application No. 13/890,316, filed on May 9, 2013, now Pat. No. 9,029,228, which is a continuation-in-part of application No. 13/652,665, filed on Oct. 16, 2012, now Pat. No. 8,884,310.

(60) Provisional application No. 61/548,899, filed on Oct. 19, 2011.

(51) Int. Cl.
*H01L 21/331* (2006.01)
*H01L 21/8222* (2006.01)
(Continued)

(52) U.S. Cl.
CPC ...... *H01L 21/02527* (2013.01); *H01L 21/0237* (2013.01); *H01L 21/0262* (2013.01);
(Continued)

(58) Field of Classification Search
CPC .................. H01L 21/0228; H01L 21/02126; H01L 21/0214; H01L 21/02614; H01L 21/02755; H01L 21/045; H01L 21/242; H01L 21/28079; H01L 21/31683; H01L 23/345; H01L 27/1203; H01L 27/3248; H01L 29/106; H01L 29/66045; H01L 29/1608; H01L 29/1606; H01L 51/0508; H01L 51/0034; H01L 51/00432; C23C 14/086; C23C 16/277; C23C 16/456
USPC ......... 438/311, 185, 186, 197, 475, 680, 791, 438/780, 769; 257/643, 649, 760, E21.005, 257/E21.006, E21.007, E21.023, E21.051, 257/E21.055, E21.056, E21.077, E21.126, 257/E21.127, E21.154, E21.155, E21.17, 257/E21.227, E21.267, E21.278, E21.293, 257/E21.32, E21.435
See application file for complete search history.

(56) References Cited

U.S. PATENT DOCUMENTS 8,158,200 B2   4/2012   Kelber
8,809,855 B2   8/2014   Yamazaki et al.
(Continued)

FOREIGN PATENT DOCUMENTS

CN      102064189 A      5/2011
WO    20100146657 A1    12/2010
WO      2012148439 A1   11/2012

OTHER PUBLICATIONS

International Search Report and Written Opinion of the International Searching Authority regarding PCT/US2014/036405 mailed on Sep. 22, 2014, 9 pgs.

(Continued)

*Primary Examiner* — David Nhu
(74) *Attorney, Agent, or Firm* — Armstrong Teasdale LLP (57) ABSTRACT

The invention generally related to a method for preparing a layer of graphene directly on the surface of a substrate, such as a semiconductor substrate. The layer of graphene may be formed in direct contact with the surface of the substrate, or an intervening layer of a material may be formed between the substrate surface and the graphene layer.

23 Claims, 2 Drawing Sheets

(51) Int. Cl.
  *H01L 21/02* (2006.01)
  *H01L 29/16* (2006.01)
  *H01L 29/267* (2006.01)
  *B82Y 40/00* (2011.01)
  *B82Y 30/00* (2011.01)
  *H01L 29/20* (2006.01)

(52) U.S. Cl.
  CPC .... *H01L21/02376* (2013.01); *H01L 21/02381* (2013.01); *H01L 21/02458* (2013.01); *H01L 21/02488* (2013.01); *H01L 21/02491* (2013.01); *H01L 21/02502* (2013.01); *H01L 21/02614* (2013.01); *H01L 29/1606* (2013.01); *H01L 29/267* (2013.01); *B82Y 30/00* (2013.01); *B82Y 40/00* (2013.01); *H01L 29/2003* (2013.01)

(56) References Cited

U.S. PATENT DOCUMENTS

| | | | |
|---|---|---|---|
| 8,884,310 | B2 | 11/2014 | Seacrist et al. |
| 9,029,228 | B2 * | 5/2015 | Seacrist et al. ............... 438/311 |
| 2012/0042922 | A1 | 2/2012 | Kondo et al. |
| 2012/0325296 | A1 | 12/2012 | Woo et al. |
| 2013/0099230 | A1 | 4/2013 | Yamazaki et al. |
| 2014/0004656 | A1 | 1/2014 | Sasagawa et al. |
| 2014/0120270 | A1 | 5/2014 | Tour et al. |
| 2014/0234200 | A1 | 8/2014 | Tour et al. |

OTHER PUBLICATIONS

Su, Ching-Yuan, et al., Direct Formation of Wafer Scale Graphene Think Layers on Insulating substrates by Chemical Vapor Deposition, NANO Letters, American Chemical Society, Aug. 11, 2011, pp. 3612-3616, vol. 11.

Peng, Zhiwei, et al., Direct Growth of Bilayer Graphene on SiO2 Substrates by Carbon Diffusion though Nickel, ACS Nano, American Chemical Society, 2011, pp. 8241-8247, vol. 5, No. 10.

Geim, A.K. et al., The Rise of Graphene, nature materials, Mar. 2007, pp. 183-191, vol. 6, Nature Publishing Group.

First, Phillip N. et al., Epitaxial Graphenes on Silicon Carbide, MRS Bulletin, Apr. 2010, pp. 296-305, vol. 35, www.mrs.org/bulletin.

Bae, Sukang et al., Roll-toroll production of 30-inch graphene films for transparent electrodes, Nature Nanotechnology, 2010, pp. 1-7, Macmillam Publishers Limited, www.nature.com/naturenanotechnology.

Yan, Zheng, et al., Growth of Bilayer Graphene on Insulting Substrates, ASC NANO, Just Accepted Manuscripts, Sep. 2, 2011, pp. 20, http://pubs.acs.org.

Berry, Vikas et al., Graphene-Based Single-Bacterium Resolution Biodevice and DNA Transistor: Interfacing Graphene Derivatives with Nanoscale and Microscale Biocomponents, Nano Lett., 2008, pp. 4469-4476, vol. 8, No. 12, ACS Publications, Washington, DC.

Kim, Deun Soo, et al., Large-scale pattern growth of graphene films for stretchable transparent electrodes; Letters, nature, 2009, doi:10.1038/nature07719, pp. 1-5.

Reina, Alfonso, Large Area, Few-Layer Graphene Films on Arbitrary Substrates by Chemical Vapor Deposition, Nano Letters, 2009, vol. 9, No. 1, 30-35, ACS Publications, Washington DC.

International Search Report and Written Opinion of the International Searching Authority regarding PCT/US2012/060810 filed on Oct. 18, 2013 issued on Apr. 8, 2013, 22 pgs.

Li, et al., Synthisis, Characterization, and Properties of Large-Area Graphene Films, ECS Transactions, 2009, pp. 41-51, vol. 19, No. 5, The Electrochemical Society.

* cited by examiner

1. DEPOSITION Ni OR THIN Cu
2. GROW BN
3. ETCH BN ON TOP
4. GROW GRAPHENE
5. ETCH GRAPHENE ON TOP
6. ETCH Ni OR Cu

Figure 2B

DIRECT AND SEQUENTIAL FORMATION OF MONOLAYERS OF BORON NITRIDE AND GRAPHENE ON SUBSTRATES

CROSS REFERENCE TO RELATED APPLICATIONS

This application is a division of U.S. application Ser. No. 13/890,316, filed May 9, 2013 and issued as U.S. Pat. No. 9,029,228 B2, the disclosure of which is hereby incorporated as if set forth in its entirety. U.S. application Ser. No. 13/890, 316 is a continuation-in-part of U.S. application Ser. No. 13/652,665, filed Oct. 16, 2012 and issued as U.S. Pat. No. 8,884,310 B2, the disclosure of which is hereby incorporated as if set forth in its entirety. U.S. application Ser. No. 13/652, 665 claims the benefit of priority to U.S. provisional application Ser. No. 61/548,889, filed Oct. 19, 2011, the disclosure of which is hereby incorporated as if set forth in its entirety.

FIELD OF THE INVENTION

The field of the invention relates generally to a method for producing graphene and other atomically thick sheets on a substrate, such as a semiconductor substrate, and more specifically to a method for producing layers of atomically thick sheets of graphene on an intervening layer, which is in contact with the semiconductor substrate, or atomically thick sheets of a material on a layer of graphene, which is in contact with the semiconductor substrate.

BACKGROUND OF THE INVENTION

Graphene is the hexagonal arrangement of carbon atoms forming a one-atom thick planar sheet of $sp^2$ hybridized (double bonded) carbon atoms arranged in a honeycomb lattice. Graphene is a promising electronic material. It has the potential to significantly impact the semiconductor industry due to its superior electrical, thermal, mechanical, and optical properties while at the same time offering compatibility with existing semiconductor processing techniques. Graphene has shown extraordinary applications, including single molecule detection, ultrafast FETs, hydrogen visualization-template for TEM, and tunable spintronic devices. Furthermore, it exhibits high thermal conductivity (25×silicon), high mechanical strength (strongest nanomaterial), high optical transparency (80%), carrier controlled interband/optical-transition and flexible structure. Electronically, graphene is a semi-metal with zero band-gap owing to the conduction band touching the valence band at two points (K and K') in the Brillouin zone. Graphene's high density of $\pi$-electrons from the $sp^2$ carbon atoms and carrier-confinement in an open crystallographic structure imparts it with the highest mobility measured to date.

In order to realize these benefits in volume manufacturing, paths to integrating graphene on large diameter semiconductor, e.g., silicon, substrates are necessary. Current processes require graphene to be transferred from a metal base to the desired substrate. This transfer process of an atomically-thick sheet is challenging and leads to low yield and a significant density of folds and tears.

Since the successful isolation, identification, and characterization of graphene by A. Geim and K. Novoselov in 2004, the most common method for producing flakes of graphene has been by tape exfoliation from graphite and transfer to oxidized silicon wafer. The transfer process for graphene from a metal (a) is not feasible for large scale synthesis due to inconsistent coverage, (b) leaves transfer polymers' residue on graphene (PMMA, PDMS, thermal-adhesive-tape) increasing carrier-scattering, and (c) produces folds, wrinkles and tears. Therefore, transfer of graphene is not feasible for industrial processing. Clearly, the scotch-tape method is not scalable for semiconductor industry. As a result of these deficiencies, this method produces small, irregularly shaped flakes of graphene and is not suitable for scaling to large diameter integration with silicon. See A. K. Geim and K. S. Novovselov, "The Rise of Graphene" Nature Materials 6 (2007) 183-191.

Research into producing wafer level graphene and large area sheets of graphene has produced the development of two main options.

First, W. deHeer's group at Georgia Institute of Technology has demonstrated the formation of graphene layers on SiC wafer by silicon sublimation and outdiffusion at very high temperature. The disadvantage of this technique is the high cost of SiC wafers, the smaller diameter SiC wafers, and the absence of integration scale possible on silicon wafers. Some groups are working on depositing SiC on Silicon and attempting to form graphene on the deposited SiC layer. See P. First, W. deHeer et al, "Epitaxial Graphenes on Silicon Carbide" MRS Bulletin 35, 296-305 (2010).

Groups in Korea and the University of Texas system have demonstrated graphene formation on metal foils such as Cu and Ni. See S. Bae et al, "Roll-to Roll Production of 30 inch Graphene Films for Transparent Electrodes" Nature Nanotechnology 5, 574-578 (2010) and X. Li et al, ECS Transactions, "Synthesis, Characterization, and Properties of Large-Area Graphene Films" 19 (5), 41-52 (2005). Using a carbon source such as methane mixed with hydrogen at temperatures in the 700-1000° C. range in a CVD chamber at pressure such as 500 mtorr, carbon is absorbed into the metal film and upon cooling segregates or precipitates to the surface of the metal foil forming single or multi-layer graphene depending on the process conditions and the metal foil. The graphene layer then has to be transferred to oxidized silicon. The transfer process generally uses a material like PMMA on graphene followed by dissolution of the metal foil, then graphene is interfaced to the silicon dioxide layer, and finally the PMMA is removed leaving graphene on $SiO_2$ on Silicon. Although the graphene formation on metal foils enables large sheets of graphene to be produced, the process for transferring large area graphene sheets to large diameter silicon substrates for electronic device fabrication is challenging. Issues such as film stress, chemical residues, bonding defects, and wrinkles in the graphene film are likely to be significant challenges for a manufacturable process.

BRIEF DESCRIPTION OF THE INVENTION

Briefly, the present invention is directed to a method of preparing a multilayer article from a semiconductor substrate, the semiconductor substrate comprising two major, generally parallel surfaces, one of which is the front surface of the semiconductor substrate and the other of which is a back surface of the semiconductor substrate, and a circumferential edge joining the front and back semiconductor substrate surfaces. The method comprises (a) forming a metal film on the front surface of the semiconductor substrate, the metal film comprising a front metal film surface, a back metal film surface, and a bulk metal region between the front and back metal film surfaces, wherein the back metal film surface is in contact with the front semiconductor substrate surface. The method comprises (b) forming a layer of boron nitride between the front surface of the semiconductor substrate and the back metal film surface. The method comprises (c) forming a layer of graphene between the front surface of the semiconductor substrate and the back metal film surface.

The present invention is further directed to a method of preparing a semiconductor substrate, the semiconductor substrate comprising two major, generally parallel surfaces, one of which is the front surface of the semiconductor substrate and the other of which is a back surface of the semiconductor substrate, and a circumferential edge joining the front and back semiconductor substrate surfaces. The method comprises forming a first metal film on the front surface of the semiconductor substrate, the first metal film comprising a front metal film surface, a back metal film surface, and a bulk metal region between the front and back metal film surfaces, wherein the back metal film surface is in contact with the front semiconductor substrate surface; forming a layer of boron nitride between the front surface of the semiconductor substrate and the back metal film surface; removing the first metal film; depositing a layer comprising a carbon-rich polymer on the layer of boron-nitride; forming a second metal film on the carbon-rich polymer layer, the second metal film comprising a front metal film surface, a back metal film surface, and a bulk metal region between the front and back metal film surfaces, wherein the back metal film surface is in contact with the layer comprising the carbon-rich polymer; and heating the semiconductor substrate comprising the layer of boron-nitride, the layer comprising the carbon-rich polymer, and the second metal film thereon in the presence of hydrogen to a temperature sufficient to degrade the carbon-rich polymer layer; and precipitating carbon atoms to thereby form a layer of graphene between the layer of boron nitride and the back metal film surface.

The present invention is still further directed to a multilayer article comprising: a semiconductor substrate comprising two major, generally parallel surfaces, one of which is the front surface of the semiconductor substrate and the other of which is a back surface of the semiconductor substrate, a circumferential edge joining the front and back surfaces, and a central plane between the front and back surfaces; a layer of boron nitride in contact with the front surface of the semiconductor substrate; and a layer of graphene in contact with the layer of boron nitride.

The present invention is still further directed to a multilayer article comprising: a semiconductor substrate comprising two major, generally parallel surfaces, one of which is the front surface of the semiconductor substrate and the other of which is a back surface of the semiconductor substrate, a circumferential edge joining the front and back surfaces, and a central plane between the front and back surfaces; a layer of graphene in contact with the front surface of the semiconductor substrate; and a layer of boron nitride in contact with the layer of graphene.

DETAILED DESCRIPTION OF THE EMBODIMENT(S) OF THE INVENTION

Figure 1:
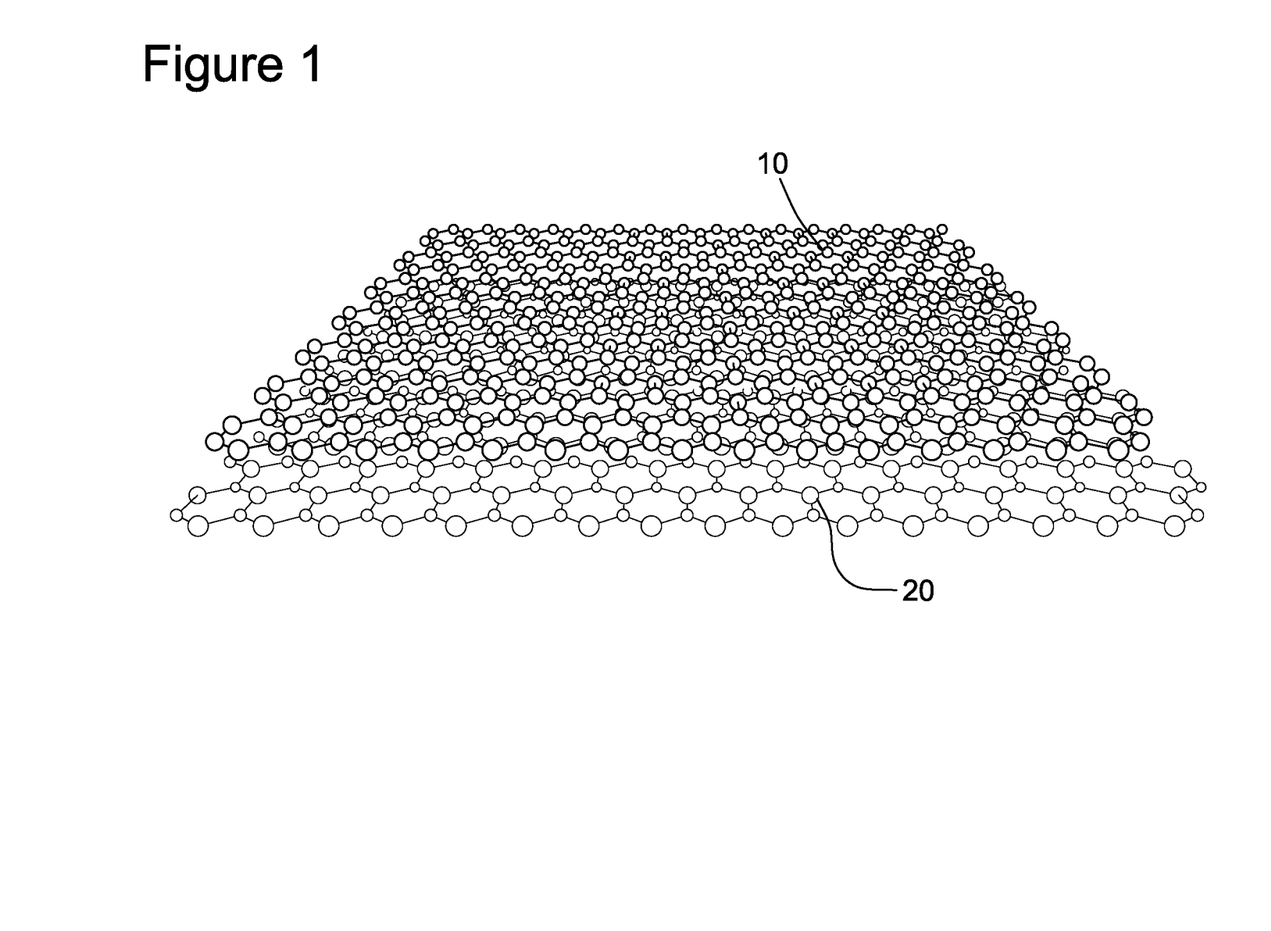
FIG. 1 is a depiction of the structure of graphene on planar boron nitride. Graphene's carbons are arranged in a two dimensional planar honeycomb lattice.
Figure 2A:
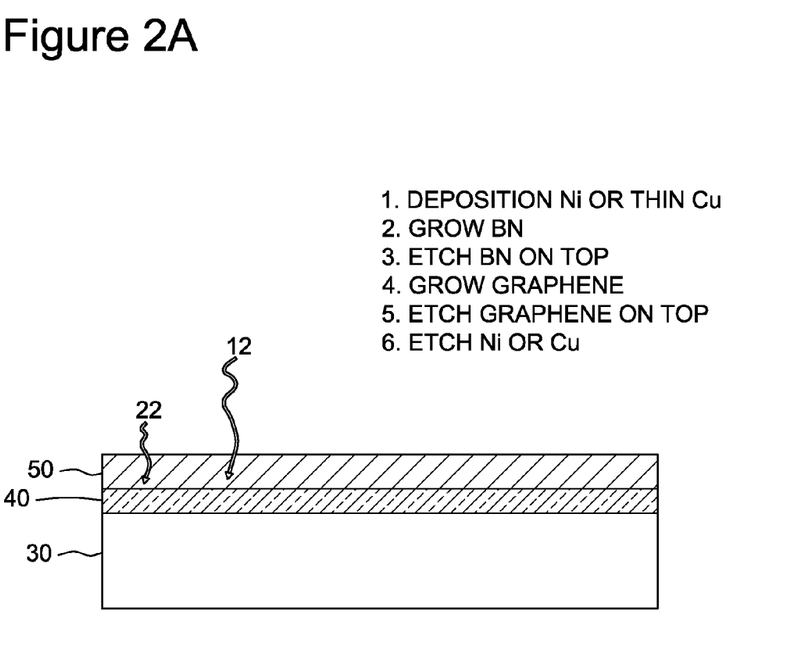
FIG. 2A is a depiction of the initial structure of the semiconductor substrate.
Figure 2B:
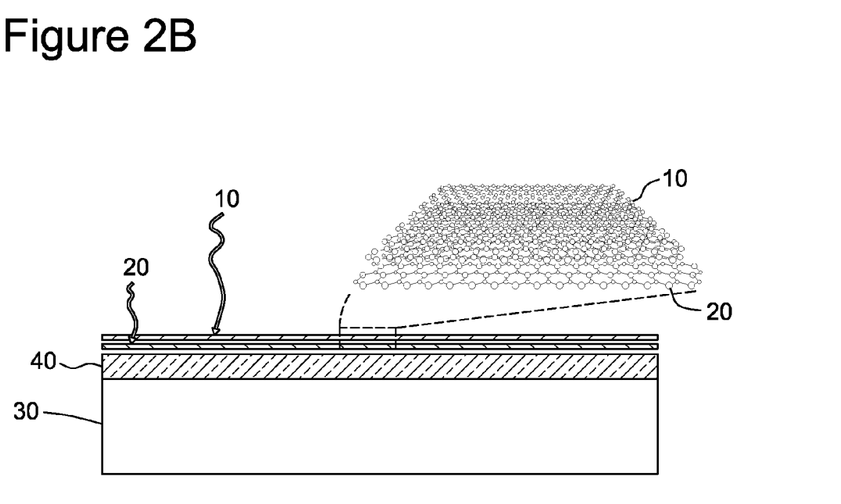
FIG. 2B is a depiction of a graphene-on-boron nitride layer on a semiconductor substrate after the CVD processing of the films and etching of the top layers and metal.

The present invention is directed to a method for forming graphene directly on a substrate, e.g., a semiconductor substrate, such as a semiconductor wafer. By direct, it is meant that the graphene is formed on the substrate without layer transfer. Direct formation does not preclude the presence of intervening layers between the substrate and the graphene layer. That is, the graphene may be formed on the surface of the substrate, or it may be formed on a surface of a layer that is in contact with the substrate. According to some embodiments of the method of the present invention, an intervening layer is deposited on the front surface of a semiconductor substrate. Thereafter, a layer of graphene is formed on the intervening layer. In some embodiments, additional layers may be deposited upon the graphene layer. The present invention is therefore additionally directed to a multilayer article comprising a semiconductor substrate, an intervening layer, and a layer of graphene. In some embodiments, the intervening layer comprises a material that is isoelectronic to the carbon lattice of graphene. In preferred embodiments, the isoelectronic intervening layer comprises boron nitride, and the multilayer article comprises a semiconductor substrate, an intervening layer of boron nitride, and a layer of graphene. See FIG. 1, which is a depiction of a graphene layer 10 on a boron nitride layer 20, which may be prepared according to the method of the present invention. See also FIG. 2B, which is a depiction of a graphene layer 10 in contact with a boron nitride layer 20 on a semiconductor substrate 30 (further comprising a dielectric layer 40) after the CVD processing of the films and etching of the top layers and metal.

According to some embodiments of the method of the present invention, a graphene layer is deposited on the front surface of a semiconductor substrate. Thereafter, a layer of another material, preferably a material that is isoelectronic with graphene, is formed on the graphene layer. In some embodiments, an additional graphene layer may be deposited upon the layer comprising the isoelectronic material. The present invention is therefore additionally directed to a multilayer article comprising a semiconductor substrate, a layer of graphene, and a layer of a material that is isoelectronic to graphene. In preferred embodiments, the isoelectronic intervening layer comprises boron nitride, and the multilayer article comprises a semiconductor substrate, an intervening layer of graphene, and a layer of boron nitride. In some embodiments, an additional layer of graphene may be deposited on the layer of boron nitride.

Incorporating an isoelectronic layer, e.g., boron nitride, between the front surface of the substrate, e.g., a semiconductor substrate, and a layer or layers of graphene, or between multiple layers of graphene, imparts several advantages to the resultant multilayer structure. Recent experiments and theory show that due to interfacial charge-traps and local-stresses, graphene on $SiO_2$ exhibits a carrier mobility of <15,000 $cm^2$/Vs, while graphene-on-BN exhibits an improved carrier mobility in the range of 60,000-150,000 $cm^2$/Vs. This is believed to be due to boron nitride's atomic-scale smoothness, insulating dielectric properties, minimum charge-impurity sites, large band-gap, low dielectric constant, a lattice-constant similar to graphene (difference=2%), and low electron-hole-puddles.

Advantageously, the method of the present invention enables coating at least a portion of a large diameter semiconductor wafer, e.g., a silicon wafer coated with silicon dioxide, with at least a layer of graphene. In some embodiments, the semiconductor substrate comprises an intervening layer of an isoelectronic material to graphene, e.g., boron nitride. In some embodiments, the semiconductor substrate comprises an intervening layer of graphene, and a layer of an isoelectronic material to graphene, e.g., boron nitride. In some embodiments, the semiconductor substrate comprises a first layer of graphene, and a layer of an isoelectronic material to graphene, e.g., boron nitride, and a second layer of graphene on the layer of boron nitride. In some embodiments, the method of the present invention enables coating at least a portion of a large diameter semiconductor wafer, e.g., a silicon wafer coated with silicon dioxide, with a layer of boron nitride and a single mono-atomic layer of graphene. In some embodiments, the method of the present invention enables coating at least a portion of a large diameter semiconductor wafer, e.g., a silicon wafer coated with silicon dioxide, with an intervening layer of boron nitride and with two mono-atomic layers of graphene. That is, the graphene layer comprises two layers of graphene of mono-atomic thickness. In some embodiments, the method of the present invention enables coating at least a portion of a large diameter semiconductor wafer, e.g., a silicon wafer coated with silicon dioxide, with a layer of boron nitride and a layer of graphene having three or more layers of graphene of mono-atomic thickness. That is, the graphene layer comprises three or more layers of graphene of mono-atomic thickness. The method of the present invention enables the deposition of several consecutive layers of mono-atomically thick graphene layers, such as between 2 layers of mono-atomically thick graphene and about 100 layers of mono-atomically thick graphene. In some embodiments, the graphene layer comprises between 2 layers of mono-atomically thick graphene and about 50 layers of mono-atomically thick graphene, such as between 3 layers of mono-atomically thick graphene and about 50 layers of mono-atomically thick graphene.

In some embodiments, the layer of boron nitride and the layer of graphene may be deposited in either order. In some embodiments, the multilayer structure comprises a semiconductor wafer, e.g., a silicon wafer, comprising a silicon oxide layer and a silicon nitride layer. Upon this substrate may be deposited a layer of boron nitride and a mono-atomically thick graphene layer, a bi-layer of mono-atomically thick graphene, or a multilayer of mono-atomically thick graphene comprising three or more layers, such as between 3 layers and about 100 layers, or about 3 layers and about 50 layers.

In embodiments of the present invention, the boron nitride layer may be a single mono-atomically thick layer, a layer comprising two layers of mono-atomically thick boron nitride, or a multilayer of mono-atomically thick boron nitride comprising three or more layers of boron nitride. In some embodiments, the boron nitride layer may comprise between 2 and about 100 consecutive layers of mono-atomically thick boron nitride layers, such as between 2 and about 50 consecutive layers of mono-atomically thick boron nitride layers, such as between 3 and about 50 consecutive layers of mono-atomically thick boron nitride layers. In some embodiments, the entire major surface of the wafer may be coated with a layer or a multi-layer of graphene. In some embodiments, a portion of the major surface of the wafer may be coated with a layer or a multi-layer of graphene.

In some embodiments, multilayer stacks of alternating boron nitride layers and graphene layers may be formed on a substrate, e.g., a semiconductor substrate. A boron nitride layer may be the first deposited layer, i.e., is in direct contact with the substrate, or the graphene layer may be the first deposited layer. In some embodiments, the multilayer may comprise a single stack of one layer of graphene and one layer of boron nitride on the substrate. In some embodiments, the multilayer may comprise two to about 100, such as about two to about 50 stacks, each stack comprising one layer of graphene and one layer of boron nitride on the substrate. Each layer herein may comprise one, two, three or more, such as about 50 mono-atomically thick layers of the graphene or boron nitride.

In general, the method of the present invention relies on deposition of a metal film on the major surface of a semiconductor substrate. The metal film comprises a metal that catalyzes the dissociation of the layer atoms, e.g., carbon, nitrogen, and boron, from precursor compounds and molecules. In some embodiments, these dissociated atoms either dissolve within the metal layer, followed by precipitation from the layer upon cooling. In embodiments wherein the metal film comprises nickel, the nickel metal film absorbs boron and nitrogen atoms (in the boron nitride deposition process) or carbon atoms (in the graphene deposition process), and the absorbed atoms precipitate out during the cooling step and the quality of the layers relates to the cooling rate. In some embodiments, these dissociated atoms diffuse through the grain-boundaries to produce graphene or BN directly on the metal-substrate interface. For thin-film-copper, the atoms diffuse through the grain-boundary and nucleate at the metal-substrate interface to form layers of boron nitride and graphene. In some embodiments, graphene and BN may also be produced at the front surface (metal-air interface) of the metal film. In such embodiments, layers that form on the front surface of the metal film are removed separately (e.g., via oxygen plasma). According to some embodiments of the method of the present invention, therefore, a semiconductor substrate (e.g., a silicon wafer which may comprise a dielectric layer such as silicon oxide and/or silicon nitride) is subject to a metal film deposition step. According to some embodiments, after this step, the semiconductor substrate comprising the metal film is exposed to precursors comprising boron and nitrogen atoms at a temperature sufficient to in-diffuse boron and nitrogen atoms into the bulk of the metal film. The article is then cooled to segregate and precipitate a layer of boron nitride between the semiconductor substrate and the back surface of the metal film. Thereafter, the multilayer structure is exposed to a carbon source whereby carbon is absorbed into the metal film. According to some embodiments, the order of layer deposition may be reversed to prepare a layer of graphene directly on the substrate, followed by a layer of boron nitride. In some embodiments, multiple layer depositions may be carried out to thereby prepare multilayer films comprising one or more graphene layers, each having an intervening layer of boron nitride. According to the method of the present invention, the graphene and boron nitride stacks may comprise graphene as the layer in direct contact with the semiconductor substrate or may comprise boron nitride as the layer in direct contact with the semiconductor substrate.

In some embodiments, the carbon source may be a hydrocarbon-containing self-assembled monolayer or a carbon-rich polymer that is deposited on a surface of the semiconductor substrate prior to deposition of the metal film. In some embodiments, the carbon source may be a combination of a hydrocarbon-containing self-assembled monolayer and a carbon-rich polymer, both of which are deposited on a surface of the semiconductor substrate prior to deposition of the metal film. In some embodiments, the carbon source may be a carbon-rich gas, e.g., methane, in which carbon is absorbed into the metal film during a vapor deposition process. In some embodiments, a solid carbon source, e.g., self-assembled monolayer and/or polymer, may be placed between the semiconductor substrate and the metal film, and the method further includes carbon absorption from a carbon-containing gas.

In some embodiments, the metal deposited on the major surface of the semiconductor substrate has high solubility at the temperature of deposition of the boron and nitrogen (in the step of forming the boron nitride layer) and carbon (at the step of forming the graphene). An exemplary such metal is nickel. In these embodiments, the boron and nitrogen may be absorbed into the metal from the source of boron and the source of nitrogen or combined source of boron and nitrogen. When the multilayer structure is cooled, boron and nitrogen segregates and precipitates from the metal film thereby depositing at least one layer of boron nitride between the semiconductor substrate and the metal film. Further, carbon may be absorbed into the metal film from the solid or gaseous carbon source. When the multilayer structure is cooled, carbon segregates and precipitates from the metal film thereby depositing at least one layer of graphene between the boron nitride layer and the metal film.

In some embodiments of the invention, the metal deposited on the major surface of the semiconductor substrate has a low or substantially zero carbon solubility at the temperature of boron/nitrogen deposition and carbon deposition. Such metals include, e.g., copper. The copper metal film may comprise copper grains. In embodiments wherein a copper film is deposited on the substrate, the B and N atoms diffuse through the grain-boundaries and nucleate at the substrate-copper interface. As the substrate is cooled, boron nitride segregates from the copper layer and forms a layer of boron nitride between the front surface of the semiconductor substrate and the back surface of the metal film. Similarly, elevated temperatures degrade the carbon source, e.g., a gaseous carbon or a carbon containing polymer, causing carbon atoms to diffuse between the copper grains. The metal surface catalyzes the growth of at least one layer of graphene between the boron nitride layer and the metal film.

In some embodiments, the metal layer may be deposited over the entire major surface of the semiconductor substrate. In some embodiments, the metal layer may be deposited over a portion of the substrate, such as at least about 10% of the total area of the major surface, or at least about 25% of the total area, or at least about 50% of the total area, or at least about 75% of the total area. In some embodiments, the metal layer may be deposited over the entire major surface of the semiconductor substrate and thereafter metal may be removed, using conventional lithography techniques, to thereby leave a desired pattern of metal deposition on the major surface of the substrate.

After formation of a multilayer structure comprising the semiconductor substrate, a layer comprising boron nitride, a layer of graphene, and metal film is complete, the metal film may be removed, e.g., by etching, thereby yielding a multilayer semiconductor structure comprising a semiconductor substrate, a layer of material that is isoelectronic to graphene, e.g., boron nitride, and a layer of graphene. In alternative embodiments, the multilayer semiconductor structure comprises a semiconductor substrate, a layer of graphene, and a layer of material that is isoelectronic to graphene, e.g., boron nitride. In embodiments of the invention, the layers of graphene and boron nitride may contain a single mono-atomically thick layer of the material, or may contain multiple mono-atomically thick layers of the material, such as between 2 and about 100 mono-atomically thick layers, or between 2 and about 50 mono-atomically thick layers, or between 3 and about 50 mono-atomically thick layers. Still further embodiments comprise stacks of alternating layers of graphene and boron nitride. The graphene layer has the same dimensions as the metal layer deposited on the major surface of the semiconductor substrate. In view thereof, the method enables preparation of graphene layers having desired patterns, e.g., by lithography of the metal layer, on the major surface of the semiconductor substrate. Advantageously, the graphene is deposited without any layer transfer steps.

According to the method of the present invention, the graphene layer or layers is/are formed directly on a semiconductor substrate, i.e., without a layer transfer step. Direct formation on the semiconductor substrate does not preclude the presence of an intervening layer, e.g., a layer of an isoelectronic material such as boron nitride. A semiconductor substrate may comprise two major, generally parallel surfaces, one of which is a front surface of the substrate and the other of which is a back surface of the substrate. A circumferential edge joins the front and back surfaces, and a central plane lies between the front and back surfaces. Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In some embodiments of the present invention, the operations of the invention are performed on the front surface of the semiconductor substrate. In some embodiments of the present invention, the operations of the present invention are performed on both the front surface and the back surface of the semiconductor substrate.

In some embodiments, the semiconductor substrate comprises a semiconductor wafer. In preferred embodiments, the semiconductor wafer comprises a material selected from among silicon, silicon carbide, silicon germanium, silicon nitride, silicon dioxide, gallium arsenide, gallium nitride, indium phosphide, indium gallium arsenide, and germanium. The semiconductor wafer may comprise combinations of such materials, e.g., in a multilayer structure. In general, the semiconductor wafer has a diameter of at least about 20 mm, more typically between about 20 mm and about 500 mm. In some embodiments, the diameter is at least about 20 mm, at least about 45 mm, at least about 90 mm, at least about 100 mm, at least about 150 mm, at least about 200 mm, at least about 250 mm, at least about 300 mm, at least about 350 mm, or even at least about 450 mm. The semiconductor wafer may have a thickness between about 100 micrometers and about 5000 micrometers, such as between about 100 micrometers and about 1500 micrometers.

In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). In some preferred embodiments, the semiconductor silicon substrate is a polished silicon wafer grown by the CZ method. The silicon substrate may have any crystal orientation, e.g., (100), (110), and (111). Silicon wafer resistivity is not critical to forming a graphene layer on the substrate. However, resistivity may vary depending upon end use requirements. In view thereof, the wafer may be heavily doped, may be semi-insulating, or may have a doping profile somewhere between. The resistivity of the wafer may therefore vary from about 1 milliohm-cm to about 10 kiloohm-cm.

In some embodiments of the method of the present invention, one or more of the major surfaces of the semiconductor substrate may be modified with a dielectric layer. In some preferred embodiments, the semiconductor substrate comprises a silicon wafer, the front surface layer of which is oxidized. In preferred embodiments, the front surface layer, i.e., the layer upon which the metal film is deposited, is oxidized. In preferred embodiments wherein the semiconductor substrate comprises a silicon wafer, the front surface of the silicon wafer is preferably oxidized such that the front surface layer of the silicon wafer comprises a silicon dioxide ($SiO_2$) layer having a thickness between about 30 nm and about 1000 nm, between about 50 nm and about 500 nm, preferably between about 50 nm and about 300 nm, such as between about 90 nm and about 300 nanometers thick, or between about 90 nm and about 200 nanometers thick. The front surface of the silicon wafer may be thermally oxidized via wet or dry oxidation, as is known in the art. Oxidation generally occurs at temperatures between about 800° C. and about 1200° C. using water vapor and/or oxygen.

In some embodiments, the semiconductor substrate may comprise a layer of silicon nitride. In some embodiments, the semiconductor substrate comprises a silicon wafer, the front surface layer of which is oxidized as described above, which is followed by deposition of a silicon nitride layer. A silicon nitride layer may be deposited on the silicon oxide layer since silicon nitride advantageously forms a barrier layer to reduce diffusion of metal atoms, e.g., nickel, into the silicon oxide layer. In some embodiments, the silicon nitride layer may range in thickness from about 50 nanometers to about 1000 nanometers. In some embodiments, the silicon nitride layer may range in thickness from about 50 nanometers to about 500 nanometers. In some embodiments, the silicon nitride layer may range in thickness from about 70 nanometers to about 250 nanometers. The thickness of the silicon nitride layer is determined in view of the trade-off between device performance, such that thinner layers are preferred, and an effective barrier to prevent in-diffusion of impurities into the semiconductor substrate, such that thicker layers are preferred. Silicon nitride may be deposited on the surface of the silicon oxide layer by contacting the substrate with an atmosphere of nitrogen at elevated temperature. For example, the semiconductor may be exposed to nitrogen gas or ammonia at temperatures ranging from about 700° C. to about 1300° C. In some embodiments, silicon nitride is formed by chemical vapor deposition at about 800° C.

According to the method of the present invention, the major surface of the semiconductor substrate, e.g., a silicon wafer comprising a silicon oxide layer and optionally a silicon nitride layer, is coated with a metal film. In some embodiments, the metal layer may be deposited over the entire major surface of the semiconductor substrate. In some embodiments, the metal layer may be deposited over a portion of the substrate, such as at least about 10% of the total area of the major surface, or at least about 25% of the total area, or at least about 50% of the total area, or at least about 75% of the total area. In some embodiments, the metal layer may be deposited over the entire major surface of the semiconductor substrate and thereafter metal may be removed selectively, using conventional lithography techniques, to thereby leave a desired pattern of metal deposition on the major surface of the substrate. In some embodiments, the front surface layer of the semiconductor substrate is coated with a metal film. The front surface layer may be completely coated with metal, partially coated with metal, or coated with a metal pattern by lithography. In some embodiments, the semiconductor substrate comprises a semiconductor wafer having a dielectric layer thereon. In some embodiments, the semiconductor substrate comprises a silicon wafer having a silicon dioxide front surface layer, and the metal film is deposited onto the silicon dioxide front surface layer. The silicon dioxide layer may be completely coated with metal, partially coated with metal, or coated with a metal pattern by lithography. In some embodiments, the semiconductor substrate comprises a silicon wafer having a silicon dioxide layer and a silicon nitride front surface layer, and the metal film is deposited onto the silicon nitride front surface layer. The silicon nitride layer may be completely coated with metal, partially coated with metal, or coated with a metal pattern by lithography. For the sake of convenience, the surfaces of the metal film may be referred to as a "front metal film surface" and "a back metal film surface." Herein, the back metal film surface is in contact with the front semiconductor substrate surface layer, which may comprise a dielectric layer, e.g., a silicon oxide layer or a silicon oxide layer and silicon nitride layer. A bulk metal region is between the front and back metal film surfaces.

Metals suitable for the present invention include nickel, copper, iron, platinum, palladium, ruthenium, cobalt, and alloys thereof. In some preferred embodiments, the metal film comprises nickel. In some preferred embodiments, the metal comprises copper. The metal film may be deposited by techniques known in the art, including sputtering, evaporation, ion beam evaporation, chemical vapor deposition, electrolytic plating, and metal foil bonding. In some embodiments, the metal film is deposited by sputtering or evaporation using, e.g., a Sputtering and Metal evaporation Unit. Electrolytic metal plating may occur according to the methods described by Supriya, L.; Claus, R. O. Solution-Based Assembly of Conductive Gold Film on Flexible Polymer Substrates: Langmuir 2004, 20, 8870-8876. In some embodiments, the metal film may be deposited by chemical vapor deposition at relatively low temperatures, such as between about 100° C. and about 300° C., such as about 200° C. Preferably, the metal film is between about 50 nanometers and about 20 micrometers thick, such as between about 50 nanometers and about 10 micrometers thick, such as between about 50 nanometers and about 1000 nanometers, such as between about 100 nanometers and about 500 nanometers, such as between about 100 nanometers and about 400 nanometers, such as about 300 nanometers or about 500 nanometers.

In some embodiments, the metal film may comprise metal that has relatively high solubility for boron, nitrogen, and carbon at elevated temperatures (i.e., generally greater than 500° C., or greater than 800° C., such as about 1000° C.), which enables in-diffusion of boron and nitrogen during deposition of the boron-nitride layer step and in-diffusion of carbon during the graphene layer step. Preferably, the metal also has low or substantially zero boron, nitrogen, or carbon solubility at cooler temperatures to thereby enable segregation and precipitation or boron and nitrogen into boron nitride and precipitation of carbon into graphene in a subsequent cooling step. High solubility metal films at the temperature of in-diffusion include nickel, iron, palladium, and cobalt. In some embodiments, the metal film comprises metal having carbon solubility of at least about 0.05 atomic % at 1000° C., preferably at least about 0.10 atomic % at 1000° C., ever more preferably at least about 0.15 atomic % at 1000° C. In some embodiments, the metal film comprises metal having carbon solubility less than about 3 atomic % at 1000° C., preferably less than about 2 atomic % at 1000° C. For example, in some preferred embodiments, the metal film comprises nickel, which has a carbon solubility of about 0.2 atomic % at 1000° C., which is the chamber temperature for carbon in-diffusion when nickel is the metal film. In some embodiments, the metal film comprises iron, which has a carbon solubility of about 0.02 atomic % at 800° C., which is the chamber temperature for carbon in-diffusion when iron is the metal film. In some embodiments, the metal film comprises cobalt, which has a carbon solubility of about 1.6 atomic % at 1000° C., which is the chamber temperature for carbon in-diffusion when cobalt is the metal film.

In some embodiments, the metal film may comprise metal that has low or substantially zero solubility or boron, nitrogen, and carbon even at elevated temperatures (i.e., generally greater than 500° C., or greater than 800° C., such as about 1000° C.). Low solubility metal films include copper, platinum, and ruthenium. For example, carbon solubility is virtually zero in copper at temperatures greater than 500° C., or greater than 800° C., such as about 1000° C. During the in-diffusion step, the gaseous atoms, e.g., boron and nitrogen or carbon, in-diffuse into the bulk metal region between metal grains, e.g., copper grains. When copper is selected as the metal for the metal film, the carbon containing gas or the carbon containing polymer is degraded by hydrogen on copper. Carbon-carbon bond formation into graphene is catalyzed by on the copper surface.

After deposition of the metal film, the multilayer structure may be cleaned. The multilayer structure comprises the semiconductor substrate, optional surface dielectric layer (e.g., silicon dioxide, which may additionally comprise a silicon nitride layer), a polymer film (in those embodiments wherein a polymer film is deposited prior to deposition of the metal film, as explained more fully below), and metal film. In some preferred embodiments, the multilayer structure may be cleaned by heating the structure in a vacuum furnace in a reducing atmosphere. A chemical vapor deposition system may be used where only baking under high vacuum is performed. In preferred embodiments, the reducing atmosphere comprises hydrogen gas or other reducing gas. An inert carrier gas may be used, such as argon or helium. In preferred embodiments, the temperature during exposure to the reducing atmosphere is preferably between about 800° C. and about 1200° C., such as about 1000° C. The pressure is preferably sub-atmospheric, such as less than about 100 Pa (less than 1 Torr), preferably less than about 1 Pa (less than 0.01 Torr), even more preferably less than about 0.1 Pa (less than 0.001 Torr), and even more preferably less than about 0.01 Pa (less than 0.0001 Torr). The cleaning anneal may adjust the grain size of the metal film, e.g., increase the grain size at elevated temperatures.

In some embodiments, after deposition of the metal film and optional cleaning, a layer of a material that is isoelectronic with graphene is formed between the front surface of the semiconductor substrate and the back surface of the metal film. In some embodiments, the isoelectronic material comprises a boron nitride layer and more specifically, the hexagonal form of boron nitride, α-BN. The boron nitride layer may be formed by contacting the front metal film surface with a boron-containing gas and a nitrogen-containing gas or a boron and nitrogen containing gas at a temperature sufficient to in-diffuse boron atoms and nitrogen atoms into the bulk metal region of the metal film. Some of the boron and nitrogen sources may be solids or liquids at room temperature. In general, the boron and nitrogen sources are gaseous at the temperature of in-diffusion. Suitable boron sources include diborane ($B_2H_6$), trichloroborane ($BCl_3$), and trifluoroborane ($BF_3$). Suitable nitrogen sources include nitrogen or ammonia. In some embodiments, the gas may comprise nitrogen and hydrogen. In some embodiments, the gas may comprise both boron and nitrogen, such as borazine ($B_3H_6N_3$), trichloroborazine (e.g., 2,4,6-trichloroborazine, $H_3B_3Cl_3N_3$), and ammonia borane ($BH_3-NH_3$). In addition to these carriers, the gaseous atmosphere may comprise inert carrier gases, such as helium and argon. The metal film is preferably contacted with sources of boron and nitrogen in an approximately 1:1 molar ratio of boron atoms and nitrogen atoms, although the ratio may vary from about 2:1 to about 1:2. The boron-containing gas and the nitrogen-containing gas may be different gases. For example, the boron-containing gas comprises diborane, and the nitrogen-containing gas comprises ammonia. In general, the multilayer substrate (refer to FIG. 2A, which depicts a semiconductor substrate 30 having a dielectric layer 40 and a metal layer (e.g., nickel or copper) 50 thereon) may be exposed to a gas 22 comprising diborane ($B_2H_6$) and the ammonia ($NH_3$) in a 1:2 molar ratio of $B_2H_6$:$NH_3$. In some embodiments, the boron-containing gas and the nitrogen-containing gas are the same gas. For example, the boron-containing gas and the nitrogen-containing gas comprises trichloroborazine (e.g., 2,4,6-trichloroborazine, $H_3B_3Cl_3N_3$), which comprises boron and nitrogen in a 1:1 molar ratio. A suitable instrument for exposing the surface of the metal film is a chemical vapor depositor with a bubbler. In a separate step, the semiconductor substrate 30 having a dielectric layer 40 and a metal layer (e.g., nickel or copper) 50 thereon is exposed to a carbon-containing gas 12 (e.g., methane) in the graphene deposition process.

In embodiments wherein the multilayer structure comprises the semiconductor substrate, optional surface dielectric layer, and the metal film, the multilayer structure undergoes a heating and cooling cycle to bring about in-diffusion of boron and nitrogen into the bulk metal region of the metal film, followed by segregation and precipitation of boron nitride between the semiconductor surface and the back surface of the metal film during cooling. The metal film may be nickel, for example, in which the temperature is sufficient to solubilize boron and nitrogen atoms in the bulk metal region. In some embodiments, the metal film may comprise a metal such as copper in which boron atoms and nitrogen atoms in-diffuse into the bulk metal region by migrating through copper grain boundaries. In some embodiments, a single mono-atomic layer of hexagonal boron nitride is precipitated between the semiconductor surface and the back surface of the metal film during cooling. In some embodiments, multiple layers of mono-atomic hexagonal boron nitride are precipitated between the semiconductor surface and the back surface of the metal film during cooling, such as at least two layers of mono-atomic hexagonal boron nitride, such as between two and about 100 layers of mono-atomic hexagonal boron nitride, or between two and about 50 layers of mono-atomic hexagonal boron nitride, or between three and about 50 layers of mono-atomic hexagonal boron nitride. In some embodiments, boron nitride may precipitate on the front surface of the metal film.

Cooling the multilayer structure lowers the solubility of boron and nitrogen within the bulk region of the metal film, which causes the boron and nitrogen to segregate from the metal film and precipitation of boron nitride between the front surface of the semiconductor substrate and the back surface of the metal film. In embodiments wherein the metal film comprises a metal in which boron and nitrogen have low solubility, e.g., copper, cooling causes segregation of boron and nitrogen from between the copper grains and onto the front surface of the semiconductor substrate as a layer of boron nitride. Accordingly, the method of the present invention is useful for preparing a multilayer article comprising the semiconductor substrate, which is optionally modified with a dielectric layer on the front surface thereof, a layer of boron nitride in contact with the front surface of the semiconductor substrate; and a metal film in contact with the layer of boron nitride.

The temperature during in-diffusion of boron and nitrogen may range from about 500° C. to about 1100° C., such as from about 700° C. to about 1000° C., such as from about 800° C. for iron or about 1000° C. for nickel. After the metal absorbs a sufficient concentration of boron and nitrogen, the multilayer structure is cooled to thereby segregate and precipitate graphene during cooling. The cooling rate is preferably controlled to a rate of about 5° C./second to about 50° C./second, such as about 10° C./second to about 30° C./second, for example about 10° C./second or about 30° C./second. The pressure of the chamber may vary from about 0.1 Pascals (about 1 mTorr) to about 70 Pascals (about 500 mTorr). The atmosphere is preferably a reducing atmosphere, which may comprise between about 1% and about 99% hydrogen, such as from about 70% and about 99% hydrogen, preferably about 95% hydrogen, balance inert gas.

In embodiments wherein cooling additionally forms a boron nitride layer on the front surface of the metal film, the method of the present invention further comprises the step of removing the layer of boron nitride from the front metal film surface prior to contacting the metal film with the carbon-containing gas. The layer of boron nitride on the front film surface may be removed by oxygen plasma etching.

According to some embodiments of the method of the present invention, the multilayer structure comprising the semiconductor substrate, optionally a dielectric layer, an intervening boron nitride layer, and the metal film may be exposed to a carbon-containing gas to thereby in-diffuse atomic carbon into the bulk region of the metal film. Atomic carbon may be solubilized in metal films comprising metals having high solubility for carbon, e.g., nickel, or may migrate between metal grains in metal films comprising metals having low solubility for carbon, e.g., copper. In some embodiments, a carbon-containing gas (12 in FIG. 2A) flow may be added to the reducing gas flow. The carbon-containing gas may be selected from among volatile hydrocarbons, for example, methane, ethane, ethylene, acetylene, propane, propylene, propyne, butanes, butylenes, butynes, and the like. The carbon-containing gas, e.g., methane, is a source of carbon that may precipitate into graphene according to the process of the present invention. The atmosphere may be a reducing atmosphere, further comprising a reducing gas, such as hydrogen. In some embodiments, the gas may comprise methane gas and hydrogen gas in a ration from about 1:1 to about 1:100, such as about 1:10. The minimum temperature during carbon in-diffusion and absorption is generally at least about 500° C. The maximum temperature during carbon in-diffusion and absorption is generally no more than about 1100° C. In general, the temperature is preferably between about 700° C. and about 1000° C. In general, the pressure inside the reaction chamber during hydrogen gas/methane flow is between about 600 Pa (about 5 Torr) and about 8000 Pa (about 60 Torr), preferably between about 1300 Pa (about 10 Torr) and about 7000 Pa (about 50 Torr).

Optionally, and preferably, after sufficient carbon has in-diffused into the bulk region of the metal film, the flow of gases is stopped and the multilayer is held at the temperature of in-diffusion for a sufficient duration to allow the carbon to distribute throughout the bulk region of the metal film. The proper duration for carbon in-diffusion to yield a product having the desired number of mono-atomically thick graphene layers may be determined by creating a calibration curve in which the number of layers of the segregated graphene in the final product is a function of the carbon in-diffusion duration. The calibration curve may be used to determine ideal carbon in-diffusion durations sufficient to yield a single mono-atomically thick graphene layer or multiple mono-atomically thick graphene layers. The duration of equilibration after the flow of carbon-containing gas is stopped may range from about 5 seconds to about 3600 seconds, such as about 600 seconds to about 1800 seconds. In some embodiments, the duration of carbon in diffusion is very short, such as about 10 seconds. Thereafter, the multilayer structure is rapidly cooled, as described above.

In some embodiments, in addition to the carbon-containing gas or as an alternative to the carbon-containing, carbon may be provided in solid form as either a carbon-containing self-assembled monolayer and/or a carbon-rich polymer. In embodiments wherein the source of carbon comprises a solid carbon source, the substrate is prepared substantially as disclosed herein. Specifically, a semiconductor substrate, e.g., a silicon wafer, may be prepared with an oxide layer and optionally an additional nitride layer. In some preferred embodiments, the semiconductor wafer comprises a silicon wafer comprising a silicon oxide layer. In some preferred embodiments, the semiconductor wafer comprises a silicon wafer comprising a silicon oxide layer and a silicon nitride layer. A metal film is deposited on the semiconductor substrate, as described herein. A layer of boron nitride is formed between the semiconductor substrate and the metal film, as described herein. Thereafter, as necessary, a layer of boron nitride on the outer surface of the metal film, if one forms, may be removed, followed by removal of the metal film, thereby preparing a semiconductor substrate comprising a layer of boron nitride thereon. In embodiments wherein a solid carbon source provides carbon for forming the graphene layer, the solid carbon source is deposited upon the layer of boron nitride. As described more fully herein, the solid carbon source may comprise a self-assembled monolayer and/or a carbon-rich polymer. A metal film is then deposited upon the solid carbon source. The multilayer structure is then subjected to a heating and cooling cycle to grow a layer of graphene between the layer of boron nitride and the metal layer.

In some embodiments of the method of the present invention, a self-assembled monolayer or few-layer comprising a hydrocarbon or a hydrocarbon with nitrogen and/or boron may be deposited on the semiconductor substrate. Herein, the hydrocarbon-containing moiety acts as a source of carbon (or B and/or N), which will in-diffuse into the subsequently applied metal film during a heating cycle or degrade into graphene (or doped graphene) wherein the metal film comprises a metal having low or substantially zero carbon solubility. The hydrocarbon provides a carbon source for graphene formation on the intervening layer of boron nitride deposited on the front surface layer of the semiconductor substrate.

In some embodiments of the method of the present invention, a carbon-rich polymer is deposited on the semiconductor substrate, e.g., a semiconductor wafer having a dielectric layer thereon and a previously formed layer of boron nitride therein, prior to forming the metal film. In some embodiments, the carbon-rich polymer is deposited on a metal layer that has been deposited on the major surface of the semiconductor wafer, the substrate further comprising an intervening boron nitride layer. In some embodiments of the method of the present invention, a carbon-rich polymer is deposited on the semiconductor substrate, e.g., a semiconductor wafer having a dielectric layer thereon and a previously formed layer of boron nitride, prior to forming the metal film, or a carbon-rich polymer layer is deposited on the surface of the metal film. Herein, the carbon-rich polymer acts as the source of carbon, which will in-diffuse into the subsequently applied metal film during a heating cycle or degrade into graphene wherein the metal film comprises a metal having low or substantially zero carbon solubility. In general, a wide variety of carbon-containing polymers are suitable. In some embodiments, the carbon-rich polymer may be selected from the group consisting of polymethylmethacrylate (PMMA), polybutadiene, polystyrene, poly(acrylonitrile-co-butadiene-co-styrene) (ABS), polyethylene, polypropylene, poly(4'-vinylhexaphenylbenzene)s, and combinations thereof.

In some embodiments, the polymer or carbon-containing film may contain nitrogen or boron in order to produce nitrogen-doped or boron-doped graphene sheets. Nitrogen-containing polymers suitable for the present invention include melamine formaldehyde, polyacrylonitrile, poly(2,5 pyridine), polypyrrole, polycarbazole, polyaniline, and combinations thereof. Boron doping may be achieved by preparing a carbon-containing layer comprising boron alcohols (non-polymeric) or by depositing Boramer™.

The carbon-rich polymer may be deposited by spin coating the substrate with a polymer film from a polymer-containing solution. Other suitable deposition methods include spray coating and electrochemical deposition. Suitable solvents for the spin-coating solution include toluene, hexane, xylene, pentane, cyclohexane, benzene, chloroform. The polymer concentration is generally between about 0.01 wt. % and about 1 wt. %, between about 0.05 wt. % and about 0.5 wt. %, such as about 0.1 wt. %.

The carbon-rich polymer layer may be deposited to a thickness between about 1 nanometer and about 100 nanometers thick, such as between about 5 nanometer and about 100 nanometers thick, preferably between about 10 nanometers and about 50 nanometers thick. In some embodiments, the carbon-rich polymer layer may be deposited to a thickness between about 1 nanometer and about 10 nanometers.

In embodiments wherein the multilayer structure comprises the semiconductor substrate, optional surface dielectric layer, a boron nitride layer, and the metal film comprising a metal that has high carbon solubility, the multilayer structure undergoes a heating and cooling cycle to bring about carbon absorption via in-diffusion into the metal film during heating, followed by carbon segregation and precipitation as graphene during cooling. In some embodiments, after sufficient carbon has in-diffused into the metal film from the carbon-containing self-assembled monolayer, the carbon-rich polymer, the carbon-containing gas or any combination thereof, according to the method of the present invention, a layer or multi-layer of graphene is precipitated between the boron nitride layer and the back metal film surface. In some embodiments, carbon atoms precipitate into a layer or multi-layer of graphene by optionally forming a temperature gradient profile in the semiconductor substrate having the metal film thereon. The temperature gradient profile is achieved by cooling the front and back surfaces of the multilayer substrate. Such cooling creates a temperature gradient in which the front metal film surface and the back metal film surface are less than the temperature near a central plane within the bulk metal region. In some embodiments, carbon atoms precipitate into a layer or multi-layer of graphene by rapidly cooling the multilayer structure. The temperature during carbon in-diffusion may range from about 500° C. to about 1000° C., such as from about 700° C. to about 1000° C., such as from about 800° C. for iron or about 1000° C. for nickel. After the metal absorbs a sufficient concentration of carbon, the multilayer structure is cooled to thereby segregate and precipitate graphene during cooling.

Cooling the multilayer structure lowers the solubility of carbon within the bulk region of the metal film, which forces the carbon to segregate from the metal film and precipitate graphene between the boron nitride layer and the back surface of the metal film. The cooling rate is preferably controlled to a rate of about 5° C./second to about 50° C./second, such as about 10° C./second to about 30° C./second, for example about 10° C./second or about 30° C./second. The pressure of the chamber may vary from about 0.1 Pascals (about 1 mTorr) to about 70 Pascals (about 500 mTorr). The atmosphere is preferably a reducing atmosphere, which may comprise between about 1% and about 99% hydrogen, such as between about 70% and about 99% hydrogen, preferably about 95% hydrogen, balance inert gas. Accordingly, the method of the present invention is useful for preparing a multilayer article comprising the semiconductor substrate, which is optionally modified with a dielectric layer on the front surface thereof, a layer of boron nitride in contact with the front surface of the semiconductor substrate, a layer of graphene in contact with the boron nitride layer, and a metal film in contact with the layer of graphene.

In embodiments wherein the solubility of carbon in a metal is low or zero (e.g., Copper), the method of the present invention advantageously yields a monolayer of graphene. In embodiments wherein graphene formation depends upon solubilization of carbon into the metal film followed by segregation and precipitation of graphene (e.g., Nickel), the method of the present invention requires control of the amount of carbon absorbed and precipitated to control the number of graphene layers produced. In either embodiment, conditions can be controlled so that at least a layer of graphene precipitates between the front surface of the semiconductor substrate and the back surface of the metal film. In some embodiments, the method of the present invention enables deposition of a single mono-atomic layer of graphene between the boron nitride layer on the front surface of the semiconductor substrate and the back surface of the metal film. In some embodiments, the method of the present invention enables deposition of multiple layers of mono-atomically thick graphene between the boron nitride layer on the front surface of the semiconductor substrate and the back surface of the metal film. The graphene layer may comprises between two and about 100 layers of mono-atomically thick graphene, such as between two and about 50 layers of mono-atomically thick graphene, or between three and about 50 layers of mono-atomically thick graphene. A second layer of graphene may precipitate at the front metal film surface. Current results to date have shown that nickel layers in particular are suitable for preparing multi-layer graphene films.

According to embodiments wherein a graphene layer precipitates upon the front metal film surface, this exterior layer or layers of graphene may be removed. In some embodiments, the exterior graphene layer or layers may be removed by etching, for example, wet etching, plasma etching, or oxidation in ozone/UV light. In preferred embodiments, the exterior layer or layers of graphene may be removed by oxygen plasma etching.

According to some embodiments, the processes for forming a graphene layer and for forming a boron nitride layer may be reversed (i.e., to deposit graphene first directly on the front surface of the substrate, followed by boron nitride, which is deposited on the graphene layer) or may be repeated to thereby prepare multilayer comprising stacks of alternative graphene and boron nitride layers.

According to some embodiments the next step of the present invention, the metal film is removed to thereby expose the graphene layer in contact with the boron nitride layer, which in turn is in contact with the front surface of the semiconductor substrate. Alternatively, the metal film is removed to thereby expose a boron nitride layer in contact with a graphene layer, which in turn is in contact with the front surface of the semiconductor substrate. The metal film may be removed by techniques known in the art adequate to dissolve the metal of the metal film, e.g., dissolution of nickel, copper, iron, or alloys thereof. In preferred embodiments, the metal film is contacted with an aqueous metal etchant. Metal etchants useful for removing the metal film include ferric chloride, iron (III) nitrate, aqua-regia, and nitric acid. Advantageously, these metal etchants will not remove graphene.

In some embodiments, upon removal of the metal film, a multilayer substrate is produced comprising a semiconductor substrate (e.g., a silicon wafer comprising a silicon oxide layer and/or a silicon nitride layer), a layer of boron nitride, and a single layer of graphene of mono-atomic thickness. In some embodiments, upon removal of the metal film, a multilayer substrate is produced comprising a semiconductor substrate (e.g., a silicon wafer comprising a silicon oxide layer and/or a silicon nitride layer), a single layer of graphene of mono-atomic thickness, and a layer of boron nitride. In some embodiments, one or both of the graphene and boron nitride layers may comprise multilayers of each material, each layer having a mono-atomic thickness. The graphene layer may be characterized to confirm the number of layers by techniques known in the art, for example, Raman spectroscopy.

In some embodiments, upon removal of the metal film, a multilayer substrate is produced comprising a semiconductor substrate, a layer of boron nitride, and a bi-layer of graphene, each layer of the bi-layer of mono-atomic thickness. In some embodiments, the graphene comprises three or more mono-atomic layers of graphene.

The formation of graphene on an oxidized silicon wafer opens up many potential applications, including single molecule detection, ultrafast FETs, hydrogen visualization-template for TEM, and tunable spintronic devices. Furthermore, graphene exhibits high thermal conductivity (25×silicon), high mechanical strength (strongest nanomaterial), high optical transparency (97%), carrier controlled interband/optical-transition and flexible structure. Graphene's high density of $\pi$-electrons from the $sp^2$ carbon atoms and carrier-confinement in an open crystallographic structure imparts it with the highest mobility measured to date. Further, the unique combination of its crystallographic and electronic structure, graphene exhibits several superior and atypical properties, including weakly-scattered ($\lambda_{scattering}$>300 nm), ballistic transport of its charge carriers at room temperature; gate-tunable band gap in bilayers; quantum Hall effect at room temperature; quantum interference; magneto-sensitive-transport; tunable optical transitions; megahertz characteristic frequency; and a chemically and geometrically controllable band gap. Other applications include bio-electronic-devices, tunable spintronics, ultra-capacitors, and nano-mechanical devices. It is anticipated that the direct graphene formation on oxidized silicon will provide a unique graphene-structure on silicon-based platform for a wide variety of electronic and sensing applications.

The following non-limiting examples are provided to further illustrate the present invention.

EXAMPLE 1

Direct Growth of Graphene on Silicon Oxide on Silicon

An approximately 5 centimeter (two inch) diameter silicon dioxide layer having a thickness of 90 nanometers was formed on an n-type ($n^{++}$) silicon substrate. The substrate was cleaned by using oxygen plasma (100 W, 600 mTorr, 2 min). A layer of PMMA was spin-coated (1% in acetone, 4000 rpm (as an example)) on the silica substrate to a thickness of about 10 nm. A 400 nm thick nickel layer was deposited on the PMMA layer in a metal evaporator system. The metal-on-PMMA-on-silica-on-silicon substrate was put inside a CVD chamber. The sample was baked at 1000° C. for 5 min to anneal the film. The atmosphere comprised hydrogen gas at a pressure of 7 Torr. Finally, the sample was rapidly cooled at 10° C./second to room temperature. This produced graphene at the interface between metal and silica. Finally, the metal film was etched with iron (III) nitrate, rendering graphene on silica-on-silicon substrate.

EXAMPLE 2

Direct Growth of Graphene on Silicon Oxide on Silicon

An approximately 5 centimeter (two inch) diameter silicon dioxide layer having a thickness of 90 nanometers was formed on an n-type ($n^{++}$) silicon substrate. The substrate was cleaned by using oxygen plasma (100 W, 600 mTorr, 2 min). A 400 nm thick nickel layer was deposited on the silicon dioxide layer in a metal evaporator system. The metal-on-silica-on-silicon substrate was put inside a CVD chamber. The sample was baked at 1000° C. for 5 min to anneal the film. The atmosphere comprised methane and hydrogen gas in a molar ration of 1:10 methane:hydrogen at a pressure of 100 Torr. Finally, the sample was rapidly cooled at 10° C./second to room temperature. This produced graphene at the interface between metal and silica. Finally, the metal film was etched with iron (III) nitrate, rendering graphene on silica-on-silicon substrate.

EXAMPLE 3

Direct Growth of Graphene on BN—$SiO_2$-on-Silicon

An approximately 5 centimeter (two inch) diameter silicon dioxide layer having a thickness of 300 nanometers was formed on an n-type ($n^{++}$) silicon substrate. The substrate was cleaned by using oxygen plasma (100 W, 600 mTorr, 2 min). Hexagonal boron nitride (hBN) flake/sheet were mechanically exfoliated and transferred onto 300 nm $SiO_2$ substrate via Scotch tape's method and washed. Subsequently, the substrate was sputtered with thin film of copper (100 nm-300 nm) using cold sputtering system. CVD growth was performed under atmosphere pressure in 4" quartz tube with the total gas flow of 100 sccm of hydrogen gas (5-10 sccm) and methane gas (95-90 sccm) at 1000° C. for 40 min. Finally, the top graphene film was $O_2$ plasma-etched and copper is washed. Raman spectroscopy revealed the signature boron nitride and G-peak of graphene.

EXAMPLE 4

Direct Growth of Graphene on BN—$SiO_2$-on-Silicon

This process will produce GBN on $SiO_2$-on-silicon substrate. A 100-400 nm nickel or copper film is deposited on a large-area $SiO_2$ substrate and placed in a CVD chamber. To produce BN film, diborane ($B_2H_6$) and ammonia (1:2 molar ratio) is fluxed into the chamber, and the sample is heat treated at 1000° C. For Ni, this will saturate the metal film with B and N atoms, and for thin-Cu, this will allow B and N atoms to diffuse through the grain boundaries to nucleate on the metal-substrate interface. For Ni, the substrate has to be cooled fast to precipitate B and N atoms to form BN at the metal-$SiO_2$-interface (and the top surface). For Ni or thin-Cu, the top BN layer is plasma-etched. Similarly, in the next step, graphene is grown at the metal-BN interface using $CH_4$ gas as the carbon-source and the top graphene layers is plasma etched. Finally, etching off the metal film gives GBN on the $SiO_2$ substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of preparing a semiconductor substrate, the semiconductor substrate comprising two major, generally parallel surfaces, one of which is a front surface of the semiconductor substrate and the other of which is a back surface of the semiconductor substrate, and a circumferential edge joining the front and back semiconductor substrate surfaces, the method comprising:
    forming a first metal film on the front surface of the semiconductor substrate, the first metal film comprising a front metal film surface, a back metal film surface, and a bulk metal region between the front and back metal film surfaces, wherein the back metal film surface of the first metal film is in contact with the front semiconductor substrate surface;
    forming a layer of boron nitride between the front surface of the semiconductor substrate and the back metal film surface of the first metal film;
    removing the first metal film;
    depositing a layer comprising a carbon-rich polymer on the layer of boron-nitride;
    forming a second metal film on the carbon-rich polymer layer, the second metal film comprising a front metal film surface, a back metal film surface, and a bulk metal region between the front and back metal film surfaces, wherein the back metal film surface of the second metal film is in contact with the layer comprising the carbon-rich polymer; and
    heating the semiconductor substrate comprising the layer of boron-nitride, the layer comprising the carbon-rich polymer, and the second metal film thereon in the presence of hydrogen to a temperature sufficient to degrade the carbon-rich polymer layer; and
    precipitating carbon atoms to thereby form a layer of graphene between the layer of boron nitride and the back metal film surface of the second metal film.

2. The method of claim 1 wherein the carbon-rich polymer is selected from the group consisting of polymethylmethacrylate (PMMA), polybutadiene, polystyrene, poly(acrylonitrile-co-butadiene-co-styrene) (ABS), polyethylene, polypropylene, poly(4'-vinylhexaphenylbenzene)s, and combinations thereof.

3. The method of claim 1 wherein the carbon-rich polymer layer has a thickness between about 1 nanometer and about 100 nanometers thick.

4. The method of claim 1 wherein the layer of boron nitride is formed by contacting the first metal film surface with a boron-containing gas and a nitrogen-containing gas at a temperature sufficient to in-diffuse boron atoms and nitrogen atoms into the bulk metal region of the first metal film; and cooling the semiconductor substrate comprising the first metal film such that boron and nitrogen precipitate out of the bulk metal region of the first metal film and form a layer of boron nitride between the back metal film surface of the first metal film and the front surface of the semiconductor substrate.

5. The method of claim 4 wherein the boron-containing gas is selected from the group consisting of diborane, trichloroborane, and trifluoroborane.

6. The method of claim 4 wherein the nitrogen-containing gas is selected from the group consisting of nitrogen and ammonia.

7. The method of claim 4 wherein the boron-containing gas and the nitrogen-containing gas is the same and the gas is selected from the group consisting of borazine, trichloroborazine, and ammonia-borane.

8. The method of claim 1 wherein the semiconductor substrate comprises a semiconductor wafer.

9. The method of claim 8 wherein the semiconductor wafer comprises a material selected from the group consisting of silicon, gallium arsenide, silicon carbide, silicon germanium, silicon nitride, silicon dioxide, and germanium, and combinations thereof.

10. The method of claim 1 wherein the front surface of the semiconductor substrate comprises a dielectric layer on the front surface thereof.

11. The method of claim 1 wherein the front surface of the semiconductor substrate comprises a silicon oxide layer on the front surface thereof.

12. The method of claim 1 wherein the front surface of the semiconductor substrates comprises a silicon oxide layer and a silicon nitride layer, wherein the silicon oxide layer is between the semiconductor substrate and the silicon nitride layer.

13. The method of claim 1 wherein the second metal film comprises a metal having a carbon solubility of at least about 0.05 atomic % at 1000° C.

14. The method of claim 1 wherein the second metal film comprises a metal having a carbon solubility of less than about 3 atomic % at 1000° C.

15. The method of claim 1 wherein the second metal film comprises a metal selected from the group consisting of nickel, copper, iron, platinum, palladium, ruthenium, cobalt and alloys thereof.

16. The method of claim 1 wherein the second metal film comprises nickel.

17. The method of claim 1 wherein the second metal film comprises copper.

18. A multilayer article comprising:
    a semiconductor substrate comprising two major, generally parallel surfaces, one of which is a front surface of the semiconductor substrate and the other of which is a back surface of the semiconductor substrate, a circumferential edge joining the front and back surfaces, and a central plane between the front and back surfaces;
    a layer of graphene in contact with the front surface of the semiconductor substrate; and
    a layer of boron nitride in contact with the layer of graphene.

19. The multilayer article of claim 18 further comprising a second layer of graphene in contact with the layer of boron nitride.

20. The multilayer article of claim 18 wherein the semiconductor substrate comprises a semiconductor wafer.

21. The multilayer article of claim 20 wherein the semiconductor wafer comprises a material selected from the group consisting of silicon, gallium arsenide, silicon carbide, silicon germanium, silicon nitride, silicon dioxide, germanium, and combinations thereof.

22. The multilayer article of claim 21 wherein the front surface of the semiconductor substrate comprises a dielectric layer.

23. The multilayer article of claim 18 wherein the layer of boron nitride comprises between 2 and about 100 monoatomically thick layers of boron nitride.

* * * * *